United States Patent [19]
Lode

[11] 3,823,396
[45] July 9, 1974

[54] DIGITAL TO ANALOG CONVERTER INCORPORATING MULTIPLE TIME DIVISION SWITCHING CIRCUITS

[75] Inventor: Tenny D. Lode, Cherry Hills Village, Colo.

[73] Assignee: Electronics Processors, Inc., Englewood, Colo.

[22] Filed: Apr. 17, 1972

[21] Appl. No.: 244,738

[52] U.S. Cl. .......... 340/347 DA
[51] Int. Cl. .......... H03k 13/06
[58] Field of Search .......... 340/347 DA

[56] References Cited

UNITED STATES PATENTS

| | | | |
|---|---|---|---|
| 3,371,334 | 2/1968 | Asher et al. | 340/347 DA |
| 3,573,803 | 4/1971 | Chatelon | 340/347 DA |
| 3,576,575 | 4/1971 | Hellwarth | 340/347 DA |
| 3,591,785 | 7/1971 | Miller | 340/347 DA |
| 3,614,776 | 10/1971 | Eshleman | 340/347 DA |
| 3,673,398 | 6/1972 | Loffbourrow | 340/347 DA |
| 3,678,502 | 7/1972 | Kienzler | 340/347 DA |

*Primary Examiner*—Malcolm A. Morrison
*Assistant Examiner*—Vincent J. Sunderdick
*Attorney, Agent, or Firm*—Dugger, Johnson & Westman

[57] ABSTRACT

A Digital-to-Analog converter system incorporating time division switching circuits whose average outputs are proportional to the values of controlling digital signals. In one form, two time division switching circuits are employed to generate "coarse" and "fine" analog voltages which are summed and filtered to obtain a composite or total converter voltage output. The coarse switching circuit is controlled by a more significant group of bits of the controlling digital word, while the fine switching circuit is controlled by a less significant group of bits of the controlling digital word. The summed and filtered voltage output is substantially proportional to the numerical value of the entire digital word.

15 Claims, 4 Drawing Figures

DIGITAL TO ANALOG CONVERTER INCORPORATING MULTIPLE TIME DIVISION SWITCHING CIRCUITS

BACKGROUND AND SUMMARY OF THE INVENTION

When a digital computer is connected to a physical system for purposes such as measurement and/or automatic control, it is often desirable to provide analog outputs from the computer (variable in small steps over a given range) in addition to the usual digital outputs (e.g., simple on/off signals). For example, one may wish to draw graphs with an analog chart plotter or provide analog signals which will be used to control valves, motors, visual indicators, or for other purposes. The usual way of doing this is to employ one or more digital-to-analog converters which generate analog voltages corresponding to digital data words transmitted from the computer. Digital-to-analog converters are also used as signal sources in test instruments, as components in analog-to-digital converters, and for many other purposes.

One form of known digital-to-analog converter is the time division switching circuit. A stable oscillator and digital counting and logic circuits are used to generate a rectangular wave whose relative on time corresponds to the numerical value of the controlling digital word. The rectangular wave is filtered and its average value taken as the desired analog output. The time division switching circuit has the advantage of requiring very little precision analog circuitry. However, it has the disadvantages that its response time may be slow, particularly in the case of higher accuracies and longer digital words.

For example, in the case of a 10-bit time division digital-to-analog converter using a 1 megahertz clock oscillator, the repetition rate of the rectangular wave output of the switching circuit will be 1,000,000/1024 or 977 hertz. The analog signal filter must pass the average value of this rectangular wave while attenuating the amplitude of the 977 hertz component to an acceptable value, generally less than one digital step. This implies a filter having a time constant of a substantial number of milliseconds. The filter time constant will largely determine the rate at which the analog voltage will respond to a change of the controlling digital word. This response time problem becomes increasingly severe as the number of bits to be converted increases.

An object of the present invention is to retain the general advantages of the time division switching circuit digital-to-analog converter while providing a significantly faster response time.

In one form of the invention, a 10-bit digital data word to be converted is split into two 5-bit groups. The more significant 5-bit group is used to control a first "coarse" time division switching circuit converter which generates an analog voltage corresponding to the more significant five bits. The less significant five bits are used to control a second "fine" time division switching converter which generates an analog voltage corresponding to the less significant five bits of the digital data word. The analog outputs of the two switching circuits are summed, giving the output of the fine converter a weight of one thirty-second that of the coarse converter, and the outputs are averaged via a single common filter. The summed, filtered output voltage is then the analog voltage at a value corresponding to the numerical value of the entire 10-bit digital data word.

The rectangular wave voltage output of each 5-bit switching circuit will have a frequency of 1,000,000/32 or 32,250 hertz. Hence, the analog output filter can have a significantly faster response time while still reducing the ripple to an acceptable level.

DESCRIPTION OF THE PREFERRED EMBODIMENTS

Figure 1:
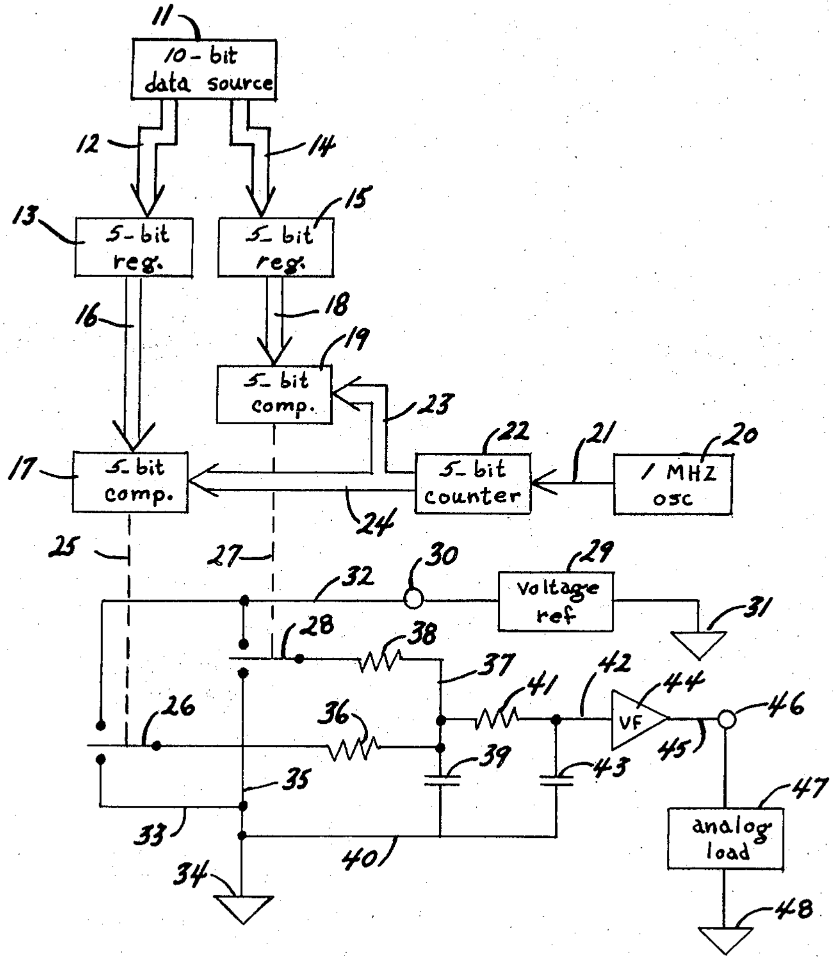
FIG. 1 is a block diagram illustrating a first form of the invention in which the outputs of two 5-bit time division switching circuits are combined to provide a 10-bit digital-to-analog conversion.

Reference is first made to FIG. 1 in which a block diagram illustrating a first form of the invention in which the voltage outputs of two time division switching circuits controlled by 5-bit portions of a digital data word are combined to provide digital-to-analog conversion for a 10-bit word. In FIG. 1, 10-bit data word source 11 is connected via a data transmission path 12 to a 5-bit register 13, and via data transmission path 14 to a 5-bit register 15. The output of register 13 is connected via data path 16 to a first input of a 5-bit comparator 17 and the output of register 15 is connected via data path 18 to a first input of a 5-bit comparator 19. The output of a 1 megahertz oscillator 20 is connected via line 21 to a 5-bit counter 22. The output of 5-bit counter 22 is connected via data path 23 to a second input of 5-bit comparator 19, and via data path 24 to a second input of 5-bit comparator 17. Comparator 17 is connected via link 25 to an analog switch 26 and comparator 19 is connected via link 27 to an analog switch 28. A voltage reference source 29 is connected between reference voltage terminal 30 and analog ground 31. Reference voltage terminal 30 is connected via line 32 to the on sides of analog switches 26 and 28. The off side of analog switch 26 is connected via line 33 to analog ground 34 and the off side of analog switch 28 is connected via line 35 to analog ground 34. The output of analog switch 26 is connected via a resistor 36 to line 37 and the output of analog switch 28 is connected via a resistor 38 to line 37. A capacitor 39 is connected between line 37 and a ground line 40 which is connected to analog ground 34. Line 37 is connected via a resistor 41 to line 42. A capacitor 43 is connected between line 42 and ground line 40. Line 42 is connected to the input of a voltage follower amplifier 44 whose output is connected via line 45 to an analog output terminal 46. An analog load 47 is connected between terminal 46 and analog ground 48.

FIG. 1 illustrates a particular digital-to-analog converter which was constructed for use as an analog output device for a digital computer. For purposes of illustration, certain specific circuit elements and component values which were used in a model are described below. Data source 11 may be a digital computer, a group of manually operated switches, a digital shaft position encoder, or such other source of digital data as may be desired. In the model, data source 11 was a digital computer which provided a 10-bit binary data word from time to time under program control. A register 13 accepts and stores the five most significant bits of the 10-bit data word, while a register 15 accepts and stores the least significant 5-bits of the data word. If data source 11 is a switch register or other device which provides the digital data at all times, registers 13 and 15 may be eliminated if desired and data source 11 connected directly to the 5-bit comparators 17 and 19. The logic circuits such as in registers 13 and 15, comparators 17 and 19, oscillator 30 and counter 22 were constructed with 7400 series TTL integrated circuit devices. The design and construction of logical circuits and systems such as digital registers, comparators and counters from such integrated circuit devices is a well-established practice in the electronic art.

Oscillator 20 uses a 4 megahertz crystal oscillator and two binary frequency divider stages to provide a 1 megahertz square wave output voltage with substantially equal on and off times. Counter 22 is a 5-bit binary counter counting from 0 (binary 00000) to 31 (binary 11111) and repeating this process over and over again in a known manner. Comparator 17 is arranged to deliver control signals so that switch 26 controlled thereby will be turned on when the count value in counter 22 passes through zero and turned off when the count value in counter 22 is equal to the 5-bit number in register 13. An override circuit is provided in comparator 17 so that if the number in register 13 is zero, switch 26 will not be turned on at all. Switch 28 is similarly controlled by signals from comparator 19 in accordance with the 5-bit binary number in register 15.

Comparators 17 and 19 are synchronized to the output signal from oscillator 20 such that on or off transitions of switches 26 and 28 can occur only when the comparison conditions are met and when triggered by an edge of a predetermined polarity of the 1 megahertz square wave signal from oscillator 20. Thus, the on and off times of switches 26 and 28 are exact integer multiples of the 1 microsecond period of oscillator 20. Counter 22 is arranged so that its counting transitions are triggered by the complementary edge of the output signal of oscillator 20 from the edge triggering the comparators. Thus, counter 22 will have stabilized to a new count value before comparators 17 and 19 deliver their control signals to the respective switches.

Figure 2:
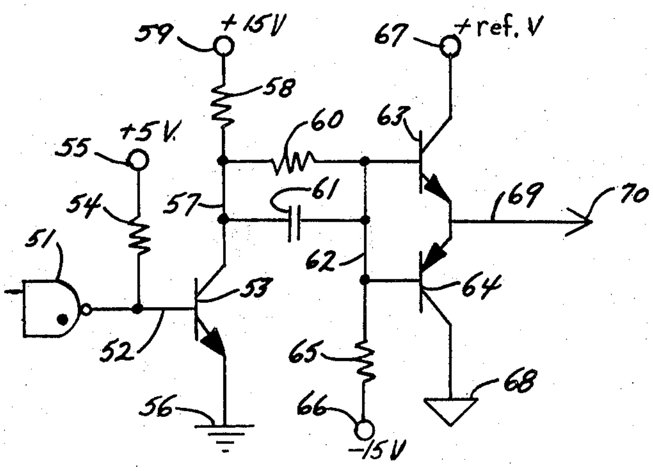
FIG. 2 is a circuit diagram illustrating a typical form of analog switch which may be used in the systems of FIGS. 1, 3 and 4.

Switches 26 and 28 are schematically shown in FIG. 1 as simple switches. In practice, electronic switches would normally be used. A suitable electronic switching circuit is shown in FIG. 2, and will be described later.

In the particular model, as shown, voltage reference source 29 provides a 5.28 volt reference potential on terminal 30 (5.28 = 5.115 times 32/31). Since a 10-bit binary number can represent values from 0 through 1023, this permits obtaining a digital-to-analog converter output which can be varied from 0.00 to 5.115 volts in steps of .005 volts. As shown, resistor 36 is 10,000 ohms, resistor 38 is 320,000 ohms, resistor 41 is 10,000 ohms, and capacitors 39 and 43 are each .068 microfarads. Resistors 36 and 38 are precision 1 percent resistors. Resistor 41 is an ordinary 5 percent composition resistor. Capacitors 39 and 43 are plastic film capacitors so as to have low leakage currents. Voltage follower amplifier 44 is a type 741 integrated circuit amplifier connected as a unity gain voltage follower circuit. The offset voltage of amplifier 44 is adjusted so that the output voltage on terminal 46 is substantially zero for a zero data word from data source 11. The techniques for adjusting the offset voltage of a type 741 integrated circuit operational amplifier are well known and are described in the manufacturers' specification sheets covering such amplifiers. Analog load 47 may be a chart recorder or other analog load as may be desired.

Amplifier 44 has a high input impedance so that there is substantially no d-c load on line 42. Hence, the average voltage on line 42 is substantially equal to the average voltage on line 37 and the average voltage on line 37 is not significantly affected by the presence of resistor 41. The average voltage at the output of switch 26 is the product of the relative on time of switch 26 and the voltage on terminal 30. The average voltage at the output of switch 28 is similarly the product of the relative on time of switch 28 and the voltage on terminal 30. Hence, the average switch 26 output voltage is proportional to the value of the 5-bit number in register 13. The average switch 28 output voltage is similarly proportional to the value of the 5-bit number in register 15. The network consisting of resistors 36 and 38 averages the output voltages of switches 26 and 28, giving the output voltage of switch 28 a weight of 1/32 that of the weight given to the output voltage of the switch 26. Hence, the average voltage on line 37 will be proportional to the value of the 10-bit binary number from data source 11. Capacitors 39 and 43 and resistor 41 serve to filter the analog output voltage on line 37, reducing the ripple to substantially less than the .005 volt value corresponding to one count.

Table 1 further illustrates the operation of the digital-to-analog converter of FIG. 1. As shown in Table 1, each 1/32 on time increment of switch 28 contributes an increment of .005 volts to the output voltage while each 1/32 on time increment of switch 26 constitutes a .16 volt increment to the total output voltage.

TABLE 1

Operation of the Digital to Analog Converter of FIG. 1

| Binary number | Decimal equivalent | Switch 26 on time | Switch 28 on time | Output voltage |
|---|---|---|---|---|
| 00000 00000 | 0 | 0/32 | 0/32 | 0.00 |
| 00000 00001 | 1 | 0/32 | 1/32 | 0.005 |
| 00000 00010 | 2 | 0/32 | 2/32 | 0.01 |
| 00000 00011 | 3 | 0/32 | 3/32 | 0.015 |
| 00000 00100 | 4 | 0/32 | 4/32 | 0.02 |
| —— —— | — | | | |
| —— —— | — | | | |
| 00000 11110 | 30 | 0/32 | 30/32 | 0.15 |
| 00000 11111 | 31 | 0/32 | 31/32 | 0.155 |
| 00001 00000 | 32 | 1/32 | 0/32 | 0.16 |
| 00001 00001 | 33 | 1/32 | 1/32 | 0.165 |
| 00001 00010 | 34 | 1/32 | 2/32 | 0.17 |
| —— —— | — | | | |
| —— —— | — | | | |
| 11111 11011 | 1019 | 31/32 | 27/32 | 5.095 |
| 11111 11100 | 1020 | 31/32 | 28/32 | 5.10 |

TABLE 1-Continued

Operation of the Digital to Analog Converter of FIG. 1

| Binary number | Decimal equivalent | Switch 26 on time | Switch 28 on time | Output voltage |
|---|---|---|---|---|
| 11111 11101 | 1021 | 31/32 | 29/32 | 5.105 |
| 11111 11110 | 1022 | 31/32 | 30/32 | 5.11 |
| 11111 11111 | 1023 | 31/32 | 31/32 | 5.115 |

The rectangular wave voltage outputs of switches 26 and 28 will have repetition rates of 1,000,000/32 or 32,250 hertz. Capacitors 39 and 43 need only be large enough to reduce the amplitude of the 32,250 hertz ripple to an acceptable value and the entire converter can have a relatively rapid response to changes in the digital data word values.

Figure 3:
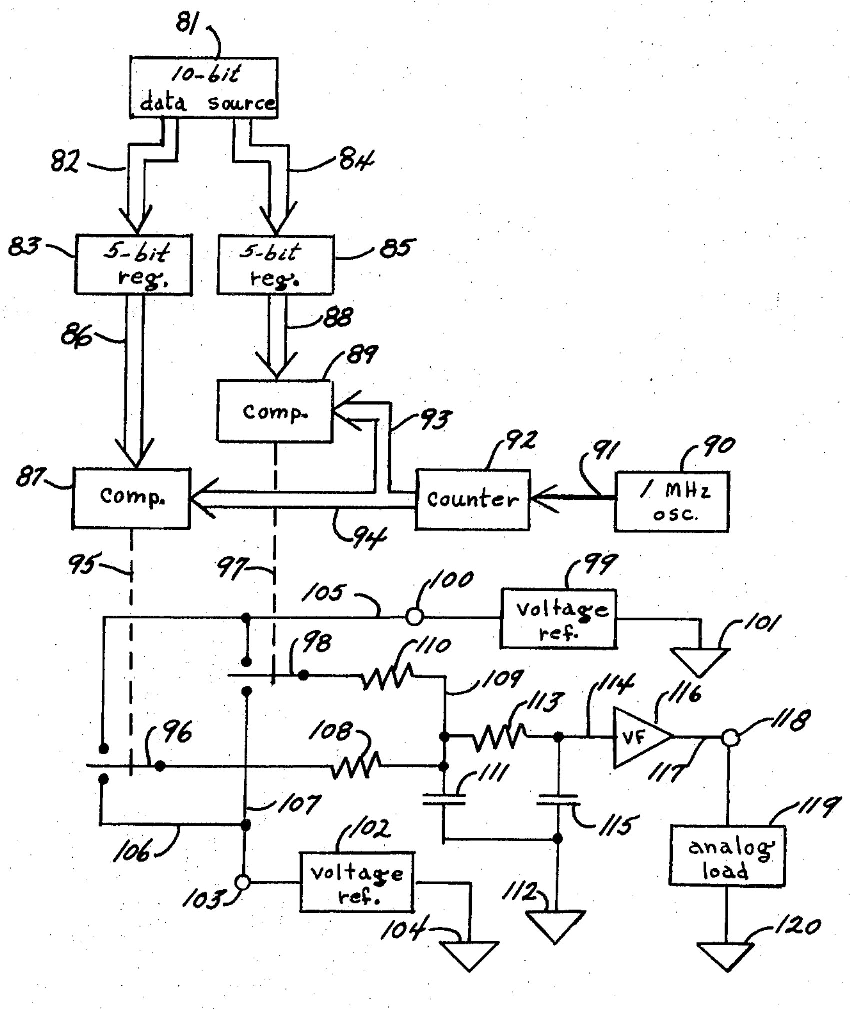
FIG. 3 is a block diagram illustrating a second form of the invention in which the outputs of two 5-bit time division switching circuits are combined to provide a 10-bit digital-to-analog conversion and incorporating certain improvements over the form of FIG. 1 so as to improve the conversion accuracy.
Figure 4:
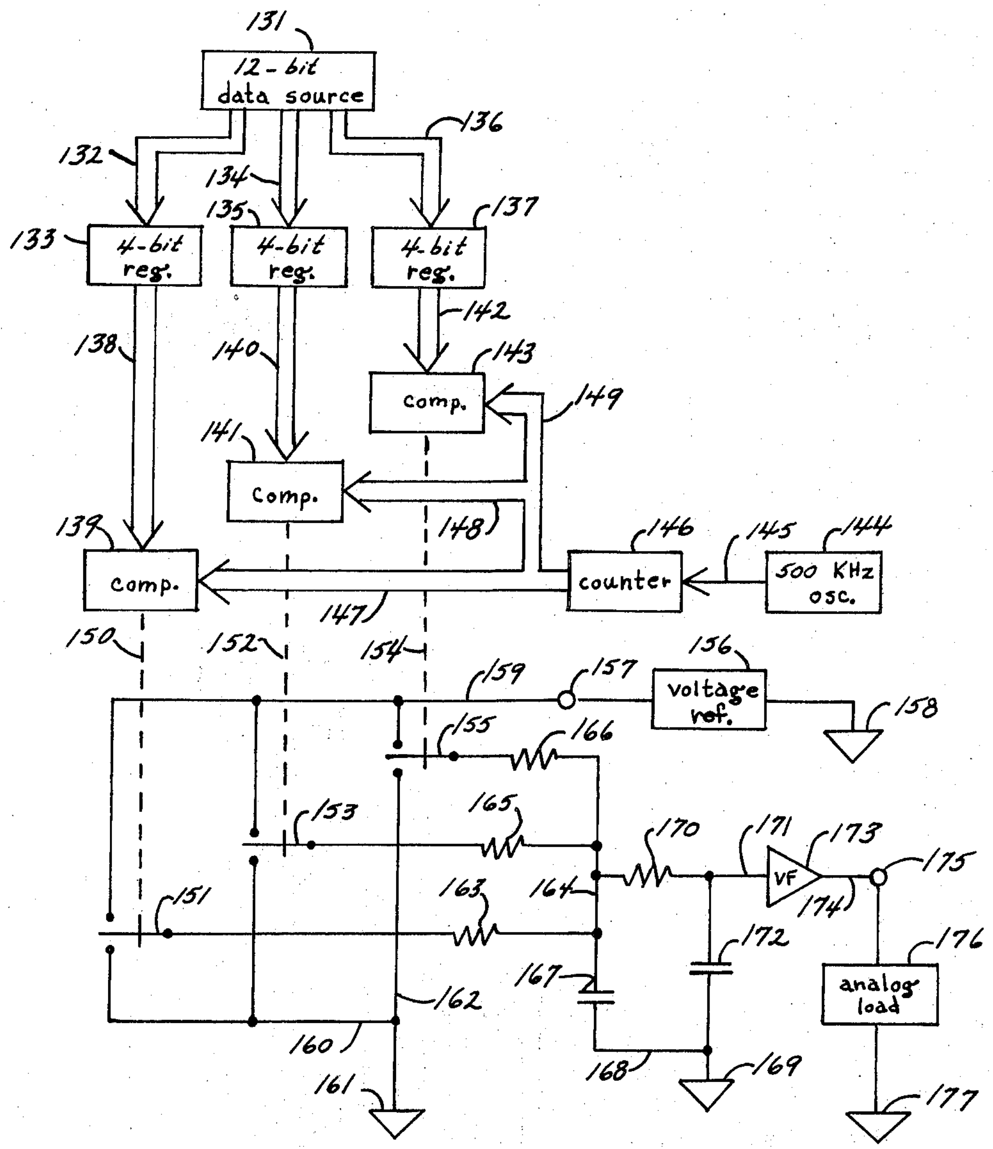
FIG. 4 is a block diagram of a third form of the invention in which the outpus of three 4-bit time division switching circuits are combined so as to provide a 12-bit digital-to-analog conversion.

Reference is now made to FIG. 2 which is a circuit diagram illustrating a form of analog switch which may be used in the systems of FIGS. 1, 3, and 4. In FIG. 2, the output of logic gate 51 is connected via line 52 to the base of transistor 53. Line 52 is connected via resistor 54 to power supply terminal 55. The emitter of transistor 53 is connected to logic ground 56. The collector of transistor 53 is connected to line 57 which is connected via resistor 58 to power supply terminal 59. Line 57 is connected via the parallel combination of resistor 60 and capacitor 61 to line 62 which is connected to the bases of transistors 63 and 64. Resistor 65 connects from line 62 to power supply terminal 66. The collector of transistor 64 is connected to analog ground 68 and the collector of transistor 63 is connected to reference voltage terminal 67. The emitters of transistors 63 and 64 are connected to line 69 and analog switch output terminal 70.

FIG. 2 illustrates an analog switching circuit which may be used for the analog switches in the systems shown in FIGS. 1, 3 and 4. It is now a common practice to use a +5 volt power supply for TTL logic circuit devices and a dual ±15 volt power supply for analog circuit devices. The circuit of FIG. 2 follows this practice. Terminal 67 is connected to a reference voltage of the order of +5 volts. In the particular model, logic gate 51 is a 7405 open-collector TTL integrated circuit gate carrying logic signals such as the signals from comparators 17 or 19 of FIG. 1. Resistor 54 is a 4,700 ohm pull-up resistor connected between the output of gate 51 and +5 volt logic power supply terminal 55. Transistor 53 is a type 2N3646 NPN silicon transistor; transistor 63 a type 2N4124 NPN silicon transistor; and transistor 64 a type 2N3638A PNP silicon transistor. Resistors 58, 60, and 65 are 820 ohms, 1,620 ohms, and 10,000 ohms, respectively. Capacitor 61 is 680 picofarads. Capacitor 61 serves to increase the speed of the switching transitions. To reduce system noise, separate ground buses are provided for the logic circuits and the analog circuits. The emitter of transistor 53, which is used as a switching element, is connected to logic ground 56. The collector of transistor 64, which is used as an analog switch, is connected to analog ground 68.

When the ouptut of gate 51 is low, transistor 53 is turned off, line 57 rises to a positive potential greater than that on terminal 67 and turns transistor 63 on in a so-called inverted mode. In inverted mode operation, the base of transistor 63 is slightly more positive than either its collector or emitter. The result is that a connection is established between the emitter and collector of transistor 63 which has a very low resistance and very little voltage offset. When the output of gate 51 is high, transistor 53 is turned on, causing line 57 to be near ground potential, and line 62 to be negative. This turns transistor 64 on in the inverted mode and establishes a low resistance, low offset voltage connection between terminal 70 and analog ground 68. Thus, when the output of gate 51 is low, terminal 70 will be connected to reference voltage terminal 67, and when the output of gate 51 is high, terminal 70 will be connected to analog ground 68. Terminal 70 corresponds to the output side of the switches shown in the other schematic diagrams.

Reference is now made to FIG. 3 which is a block diagram illustrating a second form of the invention in which the outputs of two 5-bit time division switching circuits are combined to provide a digital-to-analog conversion controlled by a 10-bit data word and incorporating certain improvements over the form of FIG. 1 so as to improve the conversion accuracy. In FIG. 3, 10-bit data word source 81 is connected via data path 82 to a 5-bit register 83 and via data path 84 to a 5-bit register 85. The output of register 83 is connected via data path 86 to a first input of comparator 87 and the output of register 85 is connected via data path 88 to a first input of comparator 89. The output of a 1 megahertz oscillator 90 is connected via line 91 to a counter 92. The output of counter 92 is connected via data path 93 to a second input of comparator 89 and via data path 94 to a second input of comparator 87. Comparator 87 is connected via link 95 to analog switch 96 and comparator 89 is connected via link 97 to analog switch 98. Voltage reference 99 is connected between reference voltage terminal 100 and analog ground 101. Voltage reference source 102 is connected between reference voltage terminal 103 and analog ground 104. Reference voltage terminal 100 is connected via line 105 to the on sides of analog switches 96 and 98. Reference voltage terminal 103 is connected via lines 106 and 107 to the off sides of analog switches 96 and 98. The output of analog switch 96 is connected via resistor 108 to line 109 and the output of analog switch 98 is connected via resistor 110 to line 109. Capacitor 111 is connected between line 109 and analog ground 112. Line 109 is connected via resistor 113 to line 114. Capacitor 115 is connected between line 114 and analog ground 112. Line 114 is connected to the input of voltage follower amplifier 116 whose output is connected via line 117 to analog output terminal 118. Analog load 119 is connected between terminal 118 and analog ground 120.

The operation of the system of FIG. 3 generally resembles the operation of the system of FIG. 1. The differences are that counter 92 and comparators 87 and 89 differ from the corresponding elements of FIG. 1, as will be described in greater detail, and that the off sides of analog switches 96 and 98 are connected to reference voltage terminal 103 rather than directly to an analog ground.

A limitation of the accuracy and usefulness of the system of FIG. 1 is that the effective turn-on and turn-off times of an analog switch may not be precisely equal. While it is possible to adjust the turn-on and turn-off times by adding capacitors or other circuit elements at appropriate points, there will still, in general, be slight differences which will not necessarily remain constant. So long as analog switch 26 of FIG. 1 is being turned on and off, any difference in its turn-on and turn-off time delays will simply have the effect of adding a constant offset voltage to the analog output. However, this is not true for transitions between the state in which switch 26 is off all the time and the state in which it is on 1/32 of the time.

As an example, assume that the turn-off time delay is 0.1 microsecond greater than the turn-on time delay. The effective on-time of switch 26 will then be 0/32, 1.1/32, 2.1/32, 3.1/32, etc. for register 13 values of 0, 1, 2, 3, etc. Thus, a difference in the turn-on and turn-off delays for analog switch 26 will introduce a discontinuity or error at the point corresponding to the transition between data source 11 values of 00000 11111 and 00001 00000. Similarly, differences in the turn-on and turn-off time delays of analog switch 28 will produce disproportional changes at every one of the 32 transitions between data source 11 values of XXXXX 00000 and XXXXX 00001. The system of FIG. 3 illustrates a means for substantially eliminating such errors.

Counter 92 is a scale of 33 counter. In one form, it is a 6-bit counter with logical feedback so that it will step directly from 011111 to 111111. The effect is that of a counter which counts from −1 through 31, a total of 33 states. Comparators 87 and 89 are arranged so that switches 96 and 98 respectively will be turned on whenever counter 92 passes through the 111111 state. Switches 96 and 98 will be turned off whenever the state of counter 92 corresponds to the 5-bit number in registers 83 and 85 respectively. When register 83 contains 00000, switch 96 will be on 1/33 of the time. When register 83 contains 11111, switch 96 will be on 32/33 of the time. Thus, switch 96 is never continually on or continually off, but will cycle between the on and off states at a repetition rate of 1,000,000/33 or 30,303 hertz. When register 85 contains digital signal group 00000 switch 98 is on for 1/33 of the time and is on for 32/33 of the time when register 85 contains 11111. The switches are on for less than the full control time (33/33) even when the controlling signal groups in the registers 83 and 85 are at a maximum value.

If the off sides of switches 96 and 98 were returned directly to an analog ground, the "bias" of 1/33 on time of switches 96 and 98 would give a corresponding bias to the analog output on terminal 118 so that a zero data word from data source 81 would not result in a zero analog output at terminal 118. The voltage on terminal 103 is adjusted so that the analog output on terminal 118 is zero (or whatever other value is desired) for a 00000 00000 data word from data source 81. The voltage on reference voltage terminal 100 is adjusted so as to provide the desired full scale voltage on terminal 118 when the data word from data source 81 is 11111 11111.

The operation of the converter of FIG. 3 is further illustrated by Table 2, which may be compared with Table 1. To obtain the output voltage values shown in Table 2, the voltage on reference voltage terminal 103 will be approximately −.165 volts, to cancel the bias due to the non-zero minimum on times of switches 96 and 98, and the voltage on voltage reference terminal 100 will be approximately 5.28 volts. This gives an output voltage range of .00 to 5.115 volts in steps of .005 volts for data source 81 binary data word values of 0 to 1023 (00000 00000 to 11111 11111).

TABLE 2

Operation of the Digital to Analog Converter of FIG. 3

| Binary number | Decimal equivalent | Switch 96 on time | Switch 98 on time | Output voltage |
|---|---|---|---|---|
| 00000 00000 | 0 | 1/33 | 1/33 | 0.00 |
| 00000 00001 | 1 | 1/33 | 2/33 | 0.005 |
| 00000 00010 | 2 | 1/33 | 3/33 | 0.01 |
| 00000 00011 | 3 | 1/33 | 4/33 | 0.015 |
| 00000 00100 | 4 | 1/33 | 5/33 | 0.02 |
| —— —— | — | | | |
| 00000 11110 | 30 | 1/33 | 31/33 | 0.15 |
| 00000 11111 | 31 | 1/33 | 32/33 | 0.155 |
| 00001 00000 | 32 | 2/33 | 1/33 | 0.16 |
| 00001 00001 | 33 | 2/33 | 2/33 | 0.165 |
| 00001 00010 | 34 | 2/33 | 3/33 | 0.17 |
| —— —— | — | | | |
| 11111 11011 | 1019 | 32/33 | 28/33 | 5.095 |
| 11111 11100 | 1020 | 32/33 | 29/33 | 5.10 |
| 11111 11101 | 1021 | 32/33 | 30/33 | 5.105 |
| 11111 11110 | 1022 | 32/33 | 31/33 | 5.11 |
| 11111 11111 | 1023 | 32/33 | 32/33 | 5.115 |

Reference is now made to FIG. 4 which is a block diagram of the third form of the invention in which the outputs of three 4-bit time division switching circuits are combined so as to provide a 12-bit digital-to-analog conversion. In FIG. 4, 12-bit data word source 131 is connected via data transmission path 132 to a 4-bit register 133, via data transmission path 134 to a 4-bit register 135, and via data path 136 to a 4-bit register 137. The output of register 133 is connected via data path 138 to a first input of a comparator 139; the output of register 135 is connected via data path 140 to a first input of a comparator 141; and the output of register 137 is connected via data path 142 to a first input of a comparator 143. A 500 kilohertz oscillator 144 is connected via line 145 to the input of a counter 146. The output of counter 146 is connected via data path 147 to a second input of comparator 139; via data path 148 to a second input of comparator 141; and via data path 149 to a second input of comparator 143. Comparator 139 is connected via link 150 to analog switch 151; comparator 141 is connected via link 152 to analog switch 153; and comparator 143 is connected via link 154 to analog switch 155. A voltage reference source 156 is connected between reference voltage terminal 157 and analog ground 158. Reference voltage terminal 157 is connected via line 159 to the on sides of analog switches 151, 153, and 155. The off sides of analog switches 151, 153, and 155 are connected via lines 160 and 162 to analog ground 161. The output of analog switch 151 is connected via resistor 163 to line 164. The outputs of analog switches 153 and 155 are similarly connected via resistors 165 and 166 to line 164. A capacitor 167 is connected between line 164 and ground line 168 which is connected to analog ground 169. Line 164 is connected via a resistor 170 to line 171. A capacitor 172 is connected between line 171 and analog ground 169. Line 171 is connected to the input of a voltage follower amplifier 173 whose output is connected via line 174 to an analog output terminal 175. An analog load 176 is connected between terminal 175 and analog ground 177.

The system of FIG. 4 generally resembles the systems of FIGS. 1 and 3, except that the data word from data source 131 is divided into three groups whose values control the actions of three comparators 139, 141, and 143 respectively and three corresponding analog switches 151, 153, 155. Oscillator 144 is shown as a 500 kilohertz oscillator rather than the 1 megahertz oscillator of the systems of FIGS. 1 and 3 as it is sometimes convenient to use a lower frequency for higher accuracy conversions. The construction and operation of comparators 139, 141, and 143 and counter 146 and the manner in which they control analog switches 151, 153, and 155 may be as in the system of FIG. 1 or as in the system of FIG. 3. For normal binary operation, the values of resistors 163, 165 and 166 will be chosen such that the voltage output of switch 153 is given a weight of 1/16 that of the voltage output of switch 151, and the voltage output of switch 155 is given a weight of 1/16 that of the voltage output of switch 153. The switch on times are controlled by signals from the respective comparators and the on times are a function of the values of the respective 4-bit portions of the 12-bit data word.

The principal point of FIG. 4 is to illustrate that systems of the type shown in FIG. 1 and of the type shown in FIG. 3 may be extended to three or more sets of comparators and analog switches. The general technique may be carried as far as desired. For example, a system generally along the lines of FIG. 4 may be constructed for the conversion of a 12-bit data word as four groups of three bits each, with four comparators and four analog switches.

The specific systems shown in this disclosure have shown the conversion of 10 and 12-bit binary data words into corresponding analog signals. It is evident that similar systems may be constructed for the conversion of binary data words of other lengths, either longer or shorter, into corresponding analog signals. For example, a system may be constructed along the lines of FIGS. 1 or 3 so as to convert a 12-binary data word via the conversion of two 6-bit groups. Similarly, a system could be constructed along the lines of FIG. 4 whereby a 9-bit binary data word was converted as three 3-bit groups.

The preceding disclosure has shown the conversion of binary data words into analog signals in a manner which includes in part the splitting of the complete data word into two or more parts each of which contains the same number of binary bits. While it will usually be convenient to do so, there is no necessity that the individual data word parts be of equal length. For example, systems of the types shown in FIGS. 1 and 3 may be constructed for the conversion of a 11-bit data word as two groups of 6 and 5-bits each, or for the conversion of a 12-bit data word as two groups of 7 and 5 bits. Similarly, a system for the conversion of a 14-bit data word could be constructed along the lines of FIG. 4 with the data word being split into groups of 5, 5 and 4 bits.

The preceding disclosure has shown the conversion of binary data words into corresponding analog signals. While binary conversion systems will frequently be convenient, particularly when used with binary digital computers or other binary data sources, it is by no means necessary that the conversion be performed in a binary manner. For example, a system of the general type shown in FIG. 4 could be constructed in which data source 131 provided a data word consisting of three decimal digits, each coded as four binary bits. Registers 133, 135 and 137 would then each contain one binary coded decimal digit. Counter 146 would be constructed as a binary coded decimal counter. Each of analog switches 151, 153 and 155 would be controlled by an associated individual decimal digit of the 3-digit decimal data word and the system would operate as a decimal digital-to-analog converter. A dual switching circuit converter, such as shown in FIGS. 1 and 3, may be constructed so as to convert a 4-digit decimal data word as two groups of two binary coded decimal digits each. In greater generality, digital-to-analog converter systems of the type shown in this disclosure may be constructed as to operate in a binary radix, in a decimal radix, or in such other radix as may be desired.

A 1 megahertz oscillator is shown in FIGS. 1 and 3, while a 500 kilohertz oscillator is shown in FIG. 4. In general, a higher oscillator frequency will tend to allow shorter filter time constants and a more rapid converter response, while a lower oscillator frequency will tend to allow more accurate conversions. The particular frequency chosen for a particular system will generally be a matter balancing these conflicting requirements.

The circuits of FIGS. 1, 3 and 4 employ networks incorporating fixed precision resistors to sum or average the individuals switch output signals. For moderate accuracy converter systems, this will generally be satisfactory. For example, in the 10-bit converter systems of FIGS. 1 and 3, the 1 to 32 ratio need only be attained with a precision of about 1 percent or so. However, for higher accuracy converters, it may be desirable to use summing networks which include one or more adjustable trimming resistors which may be adjusted to precisely set the relative weights given to the outputs of the individual analog switches. A second means of providing adjustable gains is to provide one or more individual voltage references for each of the analog switches. For example, a circuit otherwise along the lines of the system of FIG. 3 could be constructed with four voltage reference elements. The on side of switch 96 would be connected to a first voltage reference, the on side of switch 98 would be connected to a second voltage reference, the off side of switch 96 would be connected to a third voltage reference, and the off side of switch 98 would be connected to a fourth voltage reference. The individual voltage references could be then adjusted so that the output of switch 98 produced exactly 1/32 (or some other desired ratio) of the effect of the output of switch 96 upon the system analog output. Proper adjustment of these individual voltage references would also eliminate any residual offset voltage or provide whatever non-zero offset voltage may be desired in the system output.

The preceding disclosure has shown the construction of digital-to-analog converter circuits with 7400 series TTL logic devices and certain specific transistor circuits and other integrated circuit devices. Similar converter systems employing substantially the same concepts may be constructed with a wide variety of elements and devices which need not necessarily be solid state or integrated circuit components. The averaging filters shown in FIGS. 1, 3 and 5 have been simple, two-state, low-pass RC filters. If desired, more complex filters which may employ active as well as passive circuit elements may be incorporated in such converter systems.

The preceding disclosure has shown the filtering and averaging of the analog signal after summation of the individual switch output signals. If desired, filtering and averaging may be performed before summing either in addition to or in place of post summation filtering.

The preceding disclosure has shown the construction of converters which provide an analog voltage corresponding to a digital data word. Substantially similar systems may be constructed so that the available analog output is in the form of a current into a low or moderate impedance load. For example, the series combination of a resistor and a low impedance analog load could be connected between terminal 118 and analog ground 120 of FIG. 3 or between line 114 and ground 120 thereof. Such voltage or current signals may also be used to control other electronic circuits so as to provide an analog output which is a frequency, phase, or such other signal as may be desired which is controlled in accordance with the value of the digital data word.

The systems of FIGS. 1, 3 and 4 show the use of voltage follower amplifier to provide the analog output signal. This has the advantage of isolating the converter switching circuits from the analog load and making the operation of the converter relatively independent of the nature of the analog load. However, in particular applications, the voltage follower amplifier may be eliminated and/or other amplifiers of other types may be used in addition to or in place of the voltage follower amplifier.

In most conventional digital-to-analog converter systems, the object is to produce an analog output which is proportional to a predetermined constant times the numerical value of the controlling digital word. In some instances, it is desirable to provide what is known as a multiplying digital-to-analog converter in which the system output is proportional to the product of the numerical value of the digital data word and a variable input voltage. Systems capable of such operation may be constructed along the lines of the systems shown in this disclosure. For example, the system of FIG. 3 could be operated with a first variable voltage applied to terminal 100 and a second variable voltage applied to terminal 103. The system output on terminal 118 would then be of the form $(A(X) + B(1-X))$ where A is the magnitude of the first voltage applied to terminal 100, B the magnitude of the second voltage applied to terminal 103, and X a fractional value corresponding to the value of the data word from source 81.

The preceding disclosure has shown the use of two or more individual time division switching circuits in a composite digital-to-analog converter system. In some instances, it may be desirable to combine one or more time division switching circuits with one of more digital-to-analog converter circuits of a different type. For example, in the system of FIG. 4, comparator 143 and analog switch 155 may be replaced by a conventional parallel ladder network digital-to-analog converter circuit. This parallel converter circuit would be controlled by the digital data in register 137 and its analog output would be connected to the end of resistor 166 which had been previously connected to switch 155. In this case, two 4-bit groups would be converted by time division switching circuits and the third 4-bit group would be converted by a parallel, ladder network converter. The outputs of all three individual converter circuits would be summed, filtered, and passed through voltage amplifier 173 to output terminal 175.

What is claimed is:

1. A digital-to-analog converter comprising a digital data source having a digital data word of a relative value to be converted into an analog signal representative of the value of said word, said word comprising a plurality of individual digital signal components, which may form subsets comprising one or more digital signal components, a plurality of individual first means to convert digital signals to analog signals and each of said first means delivering analog signal outputs controlled by said digital data word, at least one of said first means comprising a switching circuit having means to deliver an analog output signal during a variable time period in response to a control signal, means for splitting the individual digital signal components of said digital data word into a plurality of digital signal groups, each of said digital signal groups consisting of a different subset of said digital signal components and having a value, means associated with each of said groups for controlling an individual one of said first means, including means sensing the value of at least one of said signal groups and providing said control signal to said switching circuit to regulate the time period of said analog output signal of said switching circuit in accordance with the value of said one signal group, and means coupled to each of said first means for delivering a combined analog output signal which is a function of the output signals of all of said individual first means.

2. The system of claim 1 wherein the individual first means deliver voltage outputs, said voltage outputs from each of said first means having a different magnitude than the others of said first means, said magnitudes corresponding to the significance of the respective controlling digital signal group in relation to the digital word.

3. The system of claim 2 wherein said means coupled to each of said first means for delivering said combined analog output signal comprises means for summing and averaging the analog output signals of said first means.

4. The system of claim 3 and an analog load coupled to receive the combined analog output signal.

5. The system of claim 1 wherein said switching circuit has a controllable time period including an on time and an off time and delivers a first analog output signal during a circuit on time and a second output signal during a circuit off time, said switching circuit having a non-zero on time when the associated digital signal group is at a minimum value, and having an on time less than the full controllable time period of said switching circuit when the associated digital signal group is at a maximum value.

6. The system of claim 5 and means coupling a reference voltage means into said switching circuit to provide a bias voltage producing a desired analog output signal when the data word is at a minimum value.

7. A digital-to-analog converter system including a digital data source containing a digital data word to be converted into a representative analog signal and having word components arrangable in subsets, a plurality of individual time division switching converter circuits including control input means and means to provide first analog signal outputs during a first time period which is a function of a control signal applied to said control input means of each converter circuit and to provide second signal outputs in response to a different signal at the control input means during a second time period, means for splitting said digital word into a plurality of digital signal groups each consisting of a different subset of said digital data word, means controlled by each of said signal groups to generate a control signal representative of the value of the signal group, means coupling each of said control signals to the control input means of an individual one of said converter circuits, and means for receiving the signal outputs of said individual converter circuits and delivering an analog signal which is a function of the analog signal outputs of all of said converter circuits.

8. The system of claim 7 and means providing a time cycle period and wherein said means to generate a control signal for at least one time division switching circuit includes means providing said first time period of said one time division switching circuit as a non-zero portion of said time cycle period when the respective controlling digital signal group is at a minimum value and providing said first time period of said one time division switching circuit as a time less than a full time cycle period when the respective controlling digital signal group is at a maximum value.

9. The system of claim 7 further characterized by the number of individual time division switching digital-to-analog converter circuits being greater than two.

10. A digital-to-analog converter system comprising a source of a multiple bit digital word, means for dividing the digital word into at least two different subgroups of bits each having a value, counter means to count through a desired number of states in a cyclical reference time period, separate comparator means to compare the value of each of the subgroups of bits with counts of said counter means and to deliver separate output control signals, each as a function of the time for said counter to count from the start of a time period to a count value equal to the value of each of said subgroups of bits respectively, a plurality of separate switching circuit means each including means to deliver a first analog output signal during a first state of each of said switching circuit means and a second output signal during a second state thereof, means coupling the separate output control signals of each of said comparator means to at least one switching circuit means to switch the corresponding switching circuit means to its first state for a first time period which is a function of the value of the associated subgroup of bits, and to switch the corresponding switching circuit means to its second state for the difference in time between said first time period and said reference time period, and means coupled to each of the switching circuit means to sum the analog output signals of each switching circuit means to provide a total analog output signal which is a function of the individual analog output signals of each of a plurality of switching circuit means.

11. The system of claim 10 and means controlling the value of the magnitude of the analog output signals of each swiching circuit means to a value which is a function of the significance of the subgroup of bits associated with the switching circuit means in relation to the digital word.

12. The system of claim 10 wherein said means coupled to the switching circuit means comprises means to sum and average the individual analog output signals of the switching circuit means.

13. The system of claim 10 wherein said counter counts through a value corresponding to a value below the minimum value of the subgroups of bits, and said comparator means provide signals to turn on the associated switching circuit means prior to the time the count from the counter equals the minimum value of the subgroup of bits associated with the respective comparator means.

14. The system of claim 13 wherein said counter counts through a value corresponding to a value greater than the maximum value of the subgroups of bits and said comparator means turn off the associated switching circuit means when the counter reaches a count equalling the maximum value of the associated subgroup of bits.

15. The system of claim 3 wherein said switching circuit has a cyclic controllable time period and delivers a first output signal only when a control signal is applied to the control input, and a second output signal during absence of said control signal, said switching circuit being provided with said control signal for a non-zero time interval when the associated digital signal group is at a minimum value, and being provided with said control signal for less than the controllable time period of said switching circuit when the associated digital signal group is at a maximum value.

* * * * *